United States Patent
Thompson

(10) Patent No.: US 8,970,065 B2
(45) Date of Patent: Mar. 3, 2015

(54) SYSTEM AND METHOD FOR INCREASING VOLTAGE IN A PHOTOVOLTAIC INVERTER

(75) Inventor: Christopher Scott Thompson, Kingston, RI (US)

(73) Assignee: Eaton Corporation, Cleveland, OH (US)

( * ) Notice: Subject to any disclaimer, the term of this patent is extended or adjusted under 35 U.S.C. 154(b) by 834 days.

(21) Appl. No.: 13/198,094

(22) Filed: Aug. 4, 2011

(65) Prior Publication Data

US 2013/0033112 A1 Feb. 7, 2013

(51) Int. Cl.
*H02J 1/00* (2006.01)
*H02J 1/08* (2006.01)
*H01L 31/02* (2006.01)
*H02J 1/10* (2006.01)

(52) U.S. Cl.
CPC .............. *H02J 1/08* (2013.01); *H01L 31/02021* (2013.01); *H02J 1/10* (2013.01); *Y02E 10/50* (2013.01); *H02J 2001/008* (2013.01)
USPC .......................................................... 307/71

(58) Field of Classification Search
USPC .......................................................... 307/71
See application file for complete search history.

(56) References Cited

U.S. PATENT DOCUMENTS

| | | | |
|---|---|---|---|
| 7,667,610 B2 | 2/2010 | Thompson | |
| 8,452,461 B2 * | 5/2013 | Sawyer et al. | 700/291 |
| 2008/0142071 A1 * | 6/2008 | Dorn et al. | 136/245 |
| 2010/0250018 A1 * | 9/2010 | Hauf et al. | 700/297 |
| 2010/0302731 A1 | 12/2010 | Belikoff et al. | |
| 2011/0044083 A1 | 2/2011 | Thompson | |
| 2011/0203635 A1 * | 8/2011 | Beck | 136/244 |
| 2011/0241431 A1 * | 10/2011 | Chen et al. | 307/71 |

FOREIGN PATENT DOCUMENTS

CN 101800498 A 8/2010

* cited by examiner

*Primary Examiner* — Jared Fureman
*Assistant Examiner* — Duc M Pham
(74) *Attorney, Agent, or Firm* — Ziolkowski Patent Solutions Group, SC

(57) ABSTRACT

A system and method for controlling the DC voltage provided to a PV inverter is disclosed. A PV system includes a pair of PV array group configured to generate a direct current (DC) output from received solar irradiation and a DC-to-AC power inverter electrically coupled to the pair of PV array groups to receive the DC output therefrom and invert the DC output to an AC output. The PV system also includes a switching element positioned between the pair of PV array groups and the DC-to-AC power inverter, with the switching element being configured to selectively connect the pair of PV array groups to the DC-to-AC power inverter in one of a series arrangement and a parallel arrangement, so as to control a level of DC voltage received by the DC-to-AC power inverter from the pair of PV array groups.

15 Claims, 3 Drawing Sheets

SYSTEM AND METHOD FOR INCREASING VOLTAGE IN A PHOTOVOLTAIC INVERTER

BACKGROUND OF THE INVENTION

The present invention relates generally to electronic power conversion and, more particularly, a photovoltaic (PV) inverter topology and method of controlling thereof that provides for an increased working voltage for the PV inverter.

Photovoltaic (PV) cells generate direct current (DC) power, with the level of DC current being dependent on solar irradiation and the level of DC voltage dependent on temperature. When alternating current (AC) power is desired, an inverter is used to convert the DC energy into AC energy, such as AC energy suitable for transfer to a power grid. Typical PV inverters employ two stages for power processing. The first stage of the PV inverter is configured to regulate a widely varying DC voltage from an array of PV cells, so as to provide a constant DC voltage output. The second stage of the PV inverter is configured to convert the constant DC voltage to AC current. Often, the first stage includes a boost converter, and the second stage includes a single-phase or three-phase inverter system.

For converting the varying DC voltage of a PV array to the fixed frequency AC voltage of the power grid, many PV inverters employ a two-stage conversion power circuit that uses a DC link as an intermediate energy storage step, which means that the converter first converts the unstable PV array voltage to a stable DC voltage. The PV inverter then subsequently converts the stable voltage into an AC current that can be injected into the grid. Alternatively, PV inverters can instead employ a single stage conversion power circuit in which a transformer is employed to boost the AC voltage.

With respect to typical two stage PV inverters, one drawback is that such inverters are inherently less efficient and more costly due to the second stage. That is, the efficiency of the two-stage inverter is a multiple of the individual stage efficiencies, with each stage typically causing one-half of the system losses. It would thus be beneficial to eliminate one stage of the PV inverter, i.e., eliminate the DC-DC converter, so as to increase efficiency of the inverter. However, it is recognized that elimination of the DC-DC converter would result in the inverter having a smaller DC operating window, as single stage PV inverters are recognized as having a smaller DC voltage operating window. Thus, in eliminating the DC-DC converter, a mechanism is needed that minimizes variation of the output of the PV array(s) to the PV inverter.

Another recognized drawback with existing PV array and PV inverter arrangements is that the DC power and voltage generated by the PV array groups can widely vary, as the amount of DC power/voltage generated thereby is dependent on the amount of solar irradiation received by the PV arrays. Accordingly, the PV inverter may not always be operating at an optimal working voltage if the amount of DC voltage received from the PV array is less than the optimal working voltage level. This can occur during periods of cloudy weather or early/late in the day, as the level of solar irradiation received by the PV array may not be adequate at these times. It would beneficial if the variation of the DC voltage received by the PV inverter from the PV array could be minimized and that sufficient DC voltage could be provided from the PV array to allow the PV inverter to operate at or close to an optimal working voltage, such that the PV inverter operates at a higher or peak efficiency.

It would therefore be desirable to provide a PV inverter that employs a single stage topology, as compared to a traditional two-stage PV inverter, so as to minimize system losses, while still providing the larger DC operating window of a two-stage design. It would also be desirable to provide a PV inverter, and technique for controlling thereof, that minimizes variation of the output of the PV array(s) to the PV inverter and that ensures the PV inverter is always operating at peak efficiency.

BRIEF DESCRIPTION OF THE INVENTION

The present invention provides a system and method for controlling the DC voltage provided to a PV inverter is disclosed. A switching element is provided that is positioned between a pair of PV array groups and the PV inverter that provides for the dynamic rearranging of the PV array groups in one of a series arrangement and a parallel arrangement, so as to control a level of DC voltage received by the DC-to-AC power inverter from the pair of PV array groups.

In accordance with one aspect of the invention, a PV system includes a pair of PV array groups configured to generate a direct current (DC) output from received solar irradiation, with the pair of PV array groups comprising a first PV array group and a second PV array group. The PV system also includes a DC-to-AC power inverter electrically coupled to the pair of PV array groups to receive the DC output therefrom and invert the DC output to an AC output. The PV system further includes a switching element positioned between the pair of PV array groups and the DC-to-AC power inverter, with the switching element being configured to selectively connect the pair of PV array groups to the DC-to-AC power inverter in one of a series arrangement and a parallel arrangement, so as to control a level of DC voltage received by the DC-to-AC power inverter from the pair of PV array groups.

In accordance with another aspect of the invention, a method for controlling the DC voltage provided to a PV inverter from a plurality of PV arrays is provided. The method includes measuring a DC voltage output from a pair of PV array groups, the pair of PV array groups including a first PV array group and a second PV array group and comparing the DC voltage output from the first and second PV array groups to a pre-determined voltage operating window of the PV inverter, with the pre-determined voltage operating window having lower and upper voltage limits associated therewith. The method also includes controlling switching of a switching device connected between the PV inverter and the pair of PV array groups based on the comparison of the DC voltage output from the first and second PV array groups to the pre-determined voltage operating window of the PV inverter, such that the pair of PV array groups is selectively connected to the PV inverter in one of a series arrangement and a parallel arrangement by way of the switching device.

In accordance with yet another aspect of the invention, a PV system includes a PV inverter configured to invert a DC power to an AC power, with the PV inverter further including an input electrically coupled to a pair of PV array groups that is configured to receive DC power generated by the pair of PV array groups in response to received solar irradiation, a plurality of switches configured to transform the DC power into an AC power, and an output configured to transfer the AC power to a load. The PV system also includes a switching element positioned between the pair of PV array groups and the PV inverter. The switching element is configured to selectively connect the pair of PV array groups to the PV inverter in one of a series arrangement and a parallel arrangement, so as to control a level of DC voltage received by the PV inverter from the pair of PV array groups.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION OF THE PREFERRED EMBODIMENTS

The embodiments of the invention set forth herein relate to a system and method for controlling a voltage received by a PV inverter from a PV array that provides for an increased working voltage of the PV inverter. A PV system is provided that includes a pair of PV array groups configured to generate a direct current (DC) output, with a DC-to-AC power inverter electrically coupled to the pair of PV array groups to receive the DC output therefrom and invert the DC output to an AC output. A switching element is positioned between the pair of PV array groups and the DC-to-AC power inverter that is configured to selectively connect the pair of PV array groups to the DC-to-AC power inverter in one of a series arrangement and a parallel arrangement, so as to control a level of DC voltage received by the DC-to-AC power inverter from the pair of PV array groups.

Figure 1:
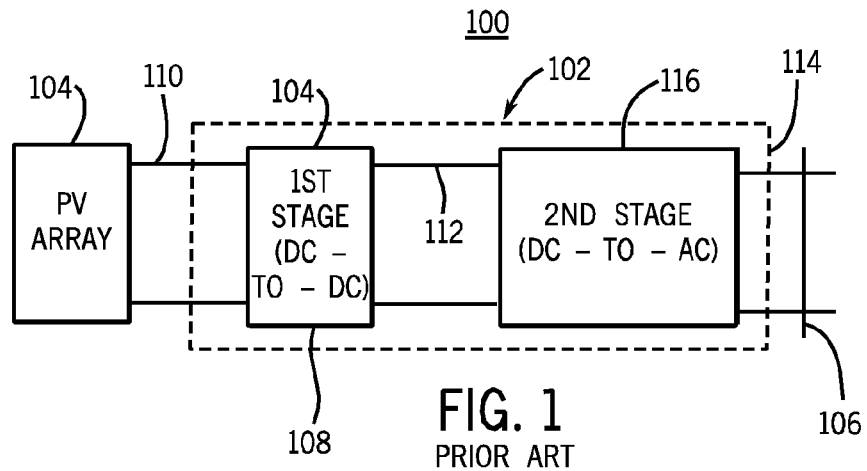
FIG. 1 is a schematic illustration of a photovoltaic inverter system that is known in the prior art.

The general structure of a photovoltaic (PV) system 100 including a PV inverter 102 that is known in the art is shown in FIG. 1. The photovoltaic inverter 102 employs a two-stage power circuit to convert a varying DC voltage from one or more PV arrays 104 to a fixed frequency AC current for a power grid 106. In a first stage, indicated as 108, PV inverter 102 performs a DC-to-DC conversion of energy received from PV array 104, such as by using a DC link capacitor (not shown) to implement an intermediate energy storage step, for example. This means that in the first stage 108, the PV inverter 102 first converts the unstable PV DC voltage 110 to a stable DC voltage 112 that is greater than the grid voltage via a boost converter. The PV inverter 102 then subsequently converts the stable DC voltage 112 to a current 114 (i.e., DC-to-AC conversion) by way of a second stage 116, with the current 114 then being injected into the grid 106. The second stage 116 of PV inverter 102 employs a plurality of switching devices (not shown) that are all switching at a high frequency and that undesirably contribute to the overall switching losses of the two-stage converter.

Figure 2:
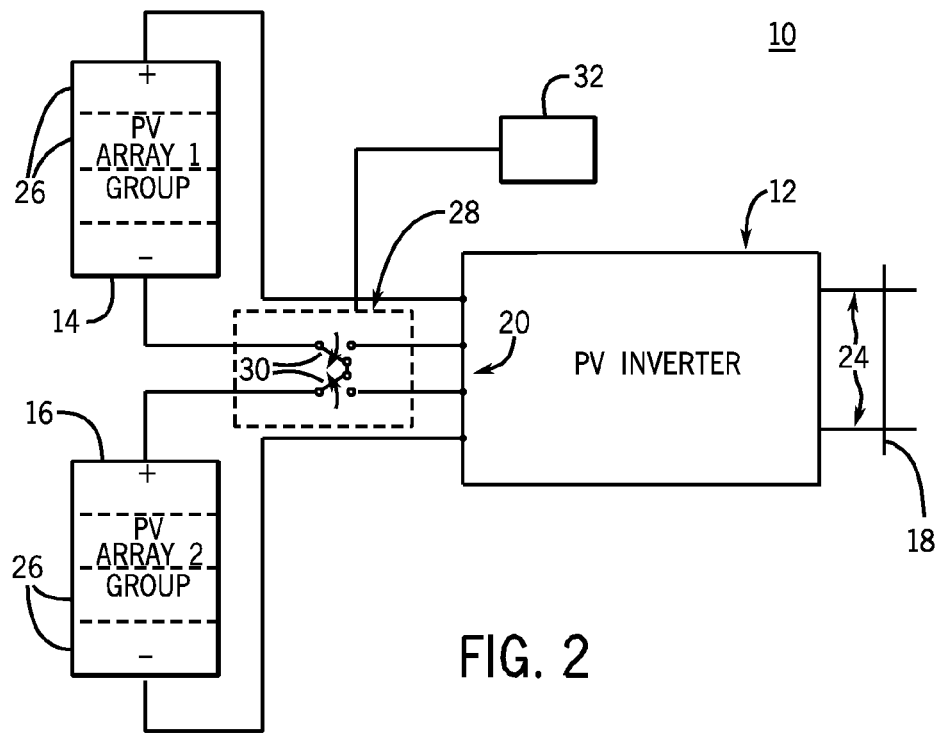
FIG. 2 is a schematic illustration of a photovoltaic inverter system according to an embodiment of the invention.

Referring now to FIG. 2, a photovoltaic (PV) system 10 is shown according to an embodiment of the invention. The PV system 10 employs a PV inverter 12 (i.e., DC-to-AC power inverter) to convert a varying DC voltage received from a plurality of PV array groups 14, 16 to a fixed frequency AC current for a power grid 18 (i.e., a DC-to-AC conversion). The PV inverter 12 includes an input 20 electrically coupled to the PV array groups 14, 16 to receive a DC voltage therefrom, a plurality of switches (not shown) that convert the DC power to an AC power, and an output 24 to transfer the AC power to a load, such as a power grid 18.

Figure 3:
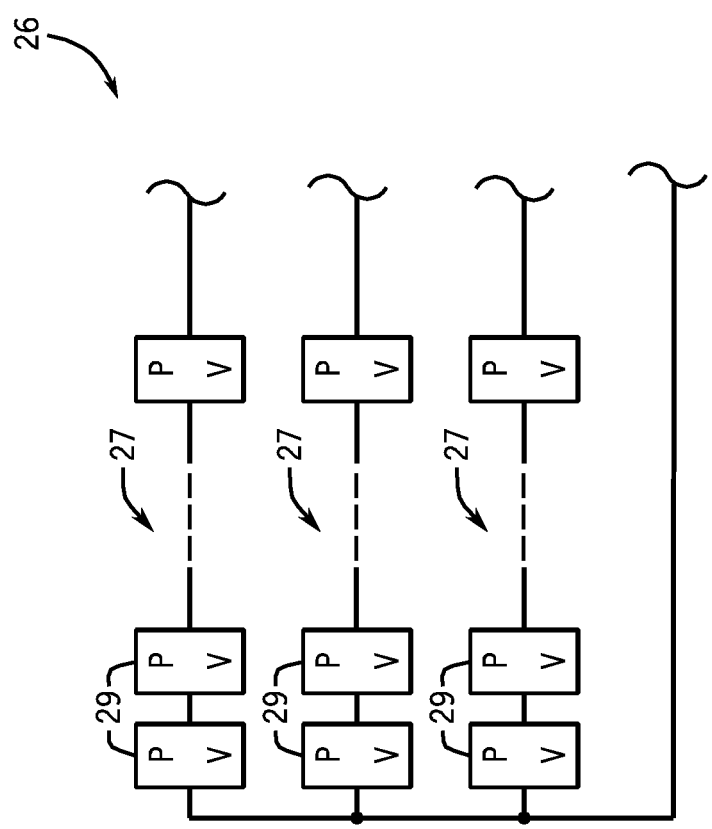
FIG. 3 is a schematic illustration of a photovoltaic array including a plurality of parallelly connected photovoltaic strings for use with the photovoltaic inverter system of FIG. 2.

As shown in FIG. 2, a pair of PV array groups is provided (i.e., first PV array group 14 and second PV array group 16) in PV system 10, with each of the first PV array group 14 and the second PV array group 16 being configured to generate a DC power responsive to received solar irradiation. Each of the first and second PV array groups 14, 16 is composed of one or more PV arrays 26, with each of the PV arrays 26 including a plurality of modules/cells therein. According on one embodiment, and as illustrated in FIG. 3, each PV array 26 includes a plurality of PV strings 27, with each PV string being comprised of a plurality of PV modules 29 that are connected in series. Referring back again to FIG. 2, and as shown therein, the number of PV arrays 26 in each of the and PV array groups 14, 16 can vary, with one, two, three, or four or more PV arrays 26 being included in each PV array group 14, 16, for example. However, according to embodiments of the invention, the number of PV arrays 26 included in the first PV array group 14 should be equal to the number of PV arrays 26 included in the second PV array group 16, such that the total number of PV arrays 26 included in the first and second PV array groups 14, 16 is an even number.

As shown in FIG. 2, the PV array groups 14, 16 are electrically coupled to PV inverter 12 by way of a switching element or device 28 positioned therebetween. According to one embodiment, the switching element 28 is in the form of an array of tie contactors 30, although it is recognized that the switching element 28 could also be in the form of any of a number of other switching elements or devices, including a relay, an IGBT, an SCR, a circuit breaker, sub-arrays of small contactors, or other suitable switching devices. The switching element 28 may be integrated into PV inverter 12 or be provided as a separate mechanism from the converter. In operation, switching element 28 functions to selectively connect the pair of PV array groups 14, 16 to the PV inverter 12 in one of a series arrangement and a parallel arrangement, so as to control a level of DC voltage received by the PV inverter 12 from the pair of PV array groups 14, 16.

By selectively connecting the first and second PV array groups 14, 16 to the PV inverter 12 in either a series arrangement or a parallel arrangement, the amount/level of voltage provided from the PV array groups 14, 16 to the PV inverter 12 can be controlled. That is, connecting the first and second PV array groups 14, 16 to the PV inverter 12 in the series arrangement serves to "double" the level of DC voltage received by the PV inverter 12 as compared to the level of DC voltage received by the PV inverter 12 when the first and second PV array groups 14, 16 are connected in the parallel arrangement. As used herein, the term "double" is meant to encompass an actual doubling of the DC voltage and also an approximate doubling of the DC voltage provided by the series arrangement as compared to the DC voltage achieved in the parallel arrangement, since it is recognized that the voltage output of the first PV array group 14 and the second PV array group 16 may not be identical and that the arrangement thereof in a series arrangement may thus not be exactly double that of the parallel arrangement.

Such a controlling of the working voltage of the PV inverter 12 is especially beneficial for operation of a PV system 10, as it is recognized that the DC power and voltage generated by the PV array groups 14, 16 is dependent on the amount of solar irradiation received by the PV arrays 26 and is thus highly variable. Accordingly, the selective connecting of the first and second PV array groups 14, 16 to the PV inverter 12 in a series arrangement or parallel arrangement that is provided by switching element 28 allows for controlling of the working voltage at which the PV inverter 12 operates. The variation of the DC voltage received by the PV inverter 12 from the pair of PV array groups 14, 16 can thus be minimized and the PV inverter 12 can be operated at an optimal working voltage within a DC voltage operating window, such that the PV inverter 12 operates at a higher or peak efficiency.

To control actuation/switching of switching element 28, and the corresponding amount/level of voltage provided from the PV array groups 14, 16 to the PV inverter 12, a controller 32 is provided in PV system 10 that is operationally coupled to the switching element 28. According to embodiments of the invention, controller 32 may be in the form of a separate dedicated controller for switching element 28 or as forming part of the existing inverter controller that controls functions of PV inverter 12 along with the controlling of switching element 28. The controller 32 functions to control switching of switching element 28 such that the PV inverter 12 is operated within a pre-determined voltage operating window, between a minimum voltage value and a maximum voltage value (i.e., upper and lower voltage limits). The controller 32 is configured to measure the DC voltage output from the first and second PV array groups 14, 16 and, as such, the controller 32 may include voltage sensors (not shown) to measure the DC voltage, according to one embodiment of the invention. The controller 32 is further configured to compare the measured DC voltage output to the voltage operating window of the PV inverter 12. Based on this comparison, the controller 32 controls the switching element 28 to connect the first and second PV array groups 14, 16 in one of the series arrangement and the parallel arrangement in order to operate the PV inverter 12 in the most efficient manner possible. That is, the controller 32 determines if the level of DC voltage to be received by the PV inverter 12 from the pair of PV array groups 14, 16, with the switching element 28 switched to connect the pair of PV array groups 14, 16 to the PV inverter 12 in the series arrangement, falls within the voltage operating window. If so, the controller 32 functions to control the switching element 28 to connect the first and second PV array groups 14, 16 in the series arrangement. Otherwise, the controller 32 functions to control the switching element 28 to connect the first and second PV array groups 14, 16 in the parallel arrangement.

According to one embodiment, the controller 32 controls switching of switching element 28 to provide a level of DC voltage to PV inverter 12 from the pair of PV array groups 14, 16 that is optimized/maximized while still falling within the pre-determined voltage operating window (i.e., at a level below the maximum voltage value). In doing so, the controller 32 compares the measured DC voltage output from the first and second PV array groups 14, 16 to the maximum voltage value of the voltage operating window. The controller 32 determines if the measured DC voltage output from the PV array groups 14, 16 is equal to or less than half the value of the maximum voltage value of the voltage operating window. If so, the controller 32 determines that the DC voltage output from the PV array groups 14, 16 can be safely "doubled" and still fall within the voltage operating window of the PV inverter 12. The controller 32 thus actuates/switches switching element 28 to arrange the first and second PV array groups 14, 16 in a series arrangement, such that the DC voltage output of the first and second PV array groups 14, 16 is added together (i.e., doubled). Conversely, if the controller 32 determines that the measured DC voltage output from the PV array groups 14, 16 is greater than half the value of the maximum voltage value of the voltage operating window, the controller 32 actuates/switches switching element 28 to arrange the first and second PV array groups 14, 16 in a parallel arrangement.

According to an embodiment of the invention, the controller 32 compares the measured DC voltage output from the first and second PV array groups 14, 16 to the minimum and maximum voltage value of the voltage operating window. The controller 32 determines if the measured DC voltage output from the PV array groups 14, 16 is less than the minimum voltage value of the voltage operating window. If so, the controller 32 determines that the DC voltage output from the PV array groups 14, 16 should be "doubled" so as to fall within the voltage operating window of the PV inverter 12. The controller 32 thus actuates/switches switching element 28 to arrange the first and second PV array groups 14, 16 in a series arrangement, such that the DC voltage output of the first and second PV array groups 14, 16 is added together (i.e., "doubled").

Figure 4:
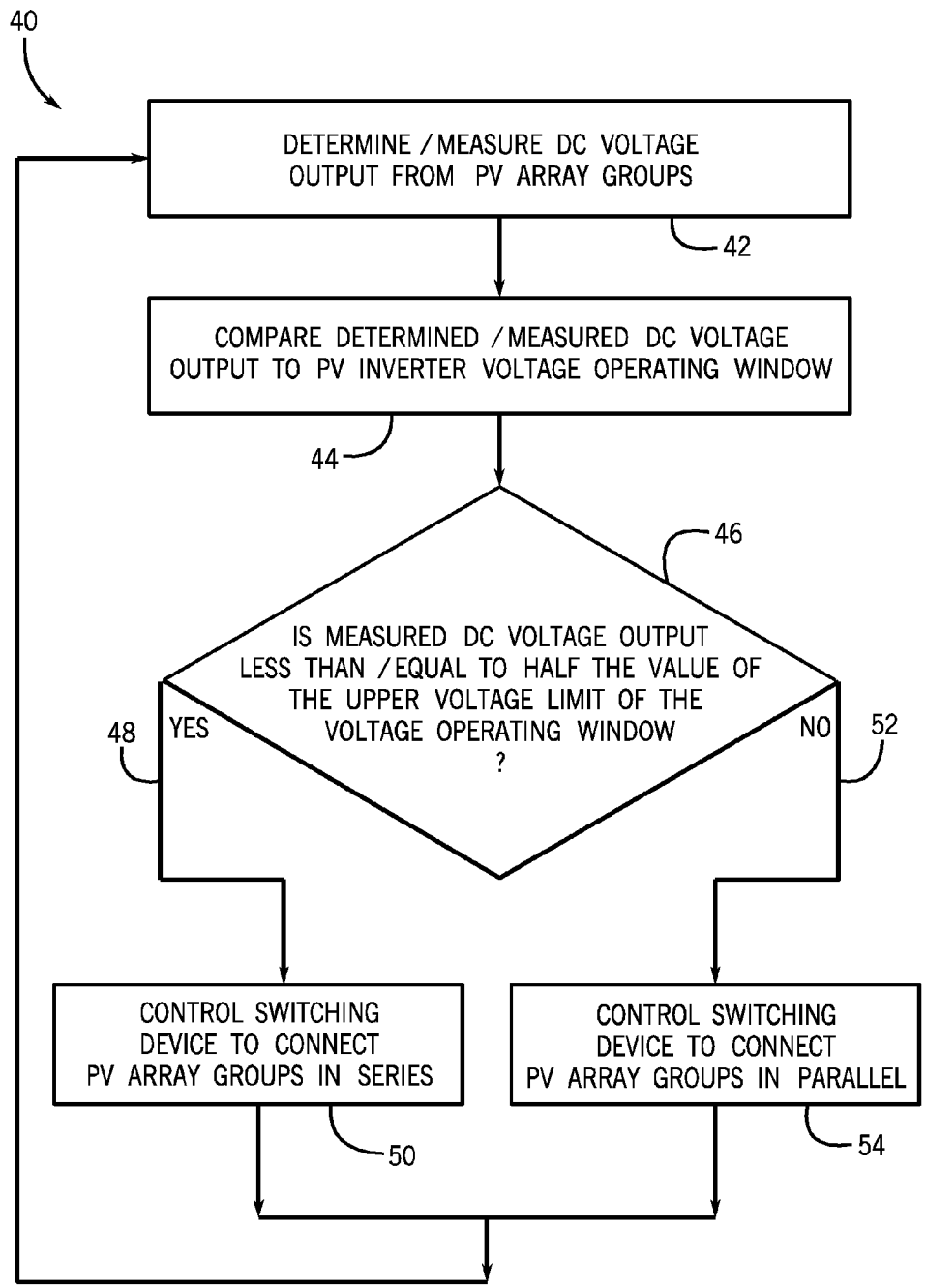
FIG. 4 is a flowchart illustrating a technique for controlling DC voltage to the photovoltaic inverter of FIG. 2 according to an embodiment of the invention.

Referring now to FIG. 4, and with continued reference to FIG. 2, a method 40 for controlling the DC voltage provided to PV inverter 12 is illustrated according to an embodiment of the invention. The method 40 is performed by a controller (e.g., controller 32) or similar control device, according to embodiments of the invention, to provide dynamic control of DC voltage provided from groups of PV arrays 14, 16 to the PV inverter 12. The method 40 begins at STEP 42 with a determination (e.g., measurement) of the DC voltage generated by and output from the first and second PV array groups 14, 16. According to embodiments of the invention, there may be adjustments performed on the measured DC voltages to account for sensor tolerance or arrays that might not be perfectly symmetrical. The measured DC voltage is then compared to the voltage operating window for the PV inverter 12 (i.e., lower and/or upper voltage limits of the operating window) at STEP 44.

At STEP 46, a determination is then made as to whether switching device 28 connecting the first and second PV array groups to the PV inverter should be positioned so as to arrange the PV array groups in a series arrangement or a parallel arrangement. As set forth in detail above, the selective connection of the first and second PV array groups to the PV inverter in either a series arrangement or a parallel arrangement controls the amount/level of voltage provided from the PV array groups to the PV inverter. That is, connecting the first and second PV array groups to the PV inverter in the series arrangement serves to "double" the level of DC voltage received by the PV inverter as compared to the level of DC voltage received by the PV inverter when the first and second PV array groups are connected in the parallel arrangement. Accordingly, the selective connecting of the first and second PV array groups to the PV inverter in a series arrangement or parallel arrangement that is provided by switching element 28 allows for controlling of the working voltage at which the PV inverter operates.

At STEP 46, a determination is thus made if the level of DC voltage to be received by the PV inverter from the pair of PV array groups, with the switching element 28 switched to connect the pair of PV array groups to the PV inverter in the series arrangement, falls within the voltage operating window. If so, the switching element 28 is controlled to connect the first and second PV array groups in the series arrangement. Otherwise, the switching element 28 is controlled to connect the first and second PV array groups in the parallel arrangement. According to the embodiment of method 40 illustrated in FIG. 3, a determination is made at STEP 46 as to whether the measured DC voltage output from the PV array groups is equal to or less than half the value of the upper voltage limit of the PV inverter voltage operating window. If it is determined that the measured DC voltage output from the PV array groups is less than half the value of the upper voltage limit 48, then it is deemed that the DC voltage output from the PV array groups can be safely "doubled" and still fall within the voltage operating window of the PV inverter. The method 40 thus proceeds to STEP 50, where switching device 28 is actuated/switched so as to arrange the first and second PV array groups in the series arrangement. Conversely, if it is determined that the measured DC voltage output from the PV array groups is greater than half the value of the upper voltage limit 52, then it is deemed that the DC voltage output from the PV array groups cannot be safely "doubled" and still fall within the voltage operating window of the PV inverter. The method 40 thus proceeds to STEP 54, where switching device 28 is actuated/switched so as to arrange the first and second PV array groups in the parallel arrangement. As illustrated in FIG. 3, the method 40 loops back to STEP 42 upon controlling of switching device 28 at STEP 50 or 52, and thus the method 40 is a dynamic technique in that the DC voltage generated by and output from the first and second PV array groups is measured throughout operation of the PV system, either on a continuous basis or on a periodic basis at certain pre-determined intervals.

Beneficially, the PV system 10 of FIG. 2 and the associated method 40 of FIG. 3 provide for the dynamic rearranging of the PV array groups 14, 16 to arrange them in one of a series arrangement and a parallel arrangement, so as to provide a controlled DC voltage to PV inverter 12. By controlling the switching device 28 in such a manner, the variation in the DC voltage that is received by PV inverter 12 is minimized, thus allowing for elimination of a DC-to-DC conversion step, such as by using a DC link capacitor 108 to implement an intermediate energy storage step, as shown in FIG. 1. According to one embodiment of the invention, the PV inverter 12 may thus be configured as a single stage inverter, which beneficially makes the PV inverter smaller, less expensive, more efficient, and more reliable.

Furthermore, the dynamic rearranging of the PV array groups 14, 16 to arrange them in one of a series arrangement and a parallel arrangement also effectively increases the DC voltage operating window of the PV system 10. For example, if a DC voltage operating window is commonly 300-600 or 500-1000 VDC, the dynamic rearranging of the PV array groups 14, 16 in series/parallel arrangements, as provided by embodiments of the invention, effectively increases the DC voltage operating window to 150-600 or 250-1000 VDC, respectively, because of the voltage "doubling" provided by the series connection of the PV array groups. Beneficially, the PV inverter 10 can thus harvest more power at high temperatures (when the voltage is low) or low irradiance (when the voltage is low), with the inverter thus turning off or being inoperable less frequently.

A technical contribution for the disclosed method and apparatus is that it provides for a controller implemented technique for providing controlled DC voltage to a photovoltaic (PV) inverter that provides for an increased working voltage for the PV inverter. A switching element is controlled to selectively connect a pair of PV array groups to the PV inverter in one of a series arrangement and a parallel arrangement, so as to control a level of DC voltage received by the PV inverter from the pair of PV array groups.

Therefore, according to one embodiment of the present invention, a PV system includes a pair of PV array groups configured to generate a direct current (DC) output from received solar irradiation, with the pair of PV array groups comprising a first PV array group and a second PV array group. The PV system also includes a DC-to-AC power inverter electrically coupled to the pair of PV array groups to receive the DC output therefrom and invert the DC output to an AC output. The PV system further includes a switching element positioned between the pair of PV array groups and the DC-to-AC power inverter, with the switching element being configured to selectively connect the pair of PV array groups to the DC-to-AC power inverter in one of a series arrangement and a parallel arrangement, so as to control a level of DC voltage received by the DC-to-AC power inverter from the pair of PV array groups.

According to another embodiment of present invention, a method for controlling the DC voltage provided to a PV inverter from a plurality of PV arrays is provided. The method includes measuring a DC voltage output from a pair of PV array groups, the pair of PV array groups including a first PV array group and a second PV array group and comparing the DC voltage output from the first and second PV array groups to a pre-determined voltage operating window of the PV inverter, with the pre-determined voltage operating window having lower and upper voltage limits associated therewith. The method also includes controlling switching of a switching device connected between the PV inverter and the pair of PV array groups based on the comparison of the DC voltage output from the first and second PV array groups to the pre-determined voltage operating window of the PV inverter, such that the pair of PV array groups is selectively connected to the PV inverter in one of a series arrangement and a parallel arrangement by way of the switching device.

According to yet another embodiment of the present invention, a PV system includes a PV inverter configured to invert a DC power to an AC power, with the PV inverter further including an input electrically coupled to a pair of PV array groups that is configured to receive DC power generated by the pair of PV array groups in response to received solar irradiation, a plurality of switches configured to transform the DC power into an AC power, and an output configured to transfer the AC power to a load. The PV system also includes a switching element positioned between the pair of PV array groups and the PV inverter. The switching element is configured to selectively connect the pair of PV array groups to the PV inverter in one of a series arrangement and a parallel arrangement, so as to control a level of DC voltage received by the PV inverter from the pair of PV array groups.

The present invention has been described in terms of the preferred embodiment, and it is recognized that equivalents, alternatives, and modifications, aside from those expressly stated, are possible and within the scope of the appending claims.

What is claimed is:

1. A photovoltaic (PV) system comprising:
    a pair of PV array groups configured to generate a direct current (DC) output from received solar irradiation, the pair of PV array groups comprising a first PV array group and a second PV array group;
    a DC-to-AC power inverter electrically coupled to the pair of PV array groups to receive the DC output therefrom, the DC-to-AC power inverter configured to invert the DC output to an AC output;
    a switching element positioned between the pair of PV array groups and the DC-to-AC power inverter, the switching element being configured to selectively connect the pair of PV array groups to the DC-to-AC power inverter in one of a series arrangement and a parallel arrangement, so as to control a level of DC voltage received by the DC-to-AC power inverter from the pair of PV array groups; and a controller configured to control switching of the switching element for connecting the pair of PV array groups to the DC-to-AC power inverter in one of the series arrangement and the parallel arrangement;
wherein the controller is configured to operate the DC-to-AC power inverter within a pre-determined voltage operating window, between a minimum voltage value and a maximum voltage value; and
wherein the controller is configured to:
measure the DC voltage output from the first and second PV array groups;
compare the DC voltage output from the first and second PV array groups to the voltage operating window; and
control the switching element to connect the first and second PV array groups in one of the series arrangement and the parallel arrangement based on the comparison of the measured DC voltage output of the first and second PV array groups to the voltage operating window.

2. The PV inverter system of claim 1 wherein connecting the first and second PV array groups in the series arrangement doubles the level of DC voltage received by the DC-to-AC power inverter as compared to the level of DC voltage received by the DC-to-AC power inverter when the first and second PV array groups are connected in the parallel arrangement.

3. The PV inverter system of claim 1 wherein the controller is configured to:
determine if the measured DC voltage output from the first and second PV array groups is equal to or less than half the value of the maximum voltage value of the voltage operating window; and
if the measured DC voltage output from the first and second PV array groups is equal to or less than half the value of the maximum voltage value of the voltage operating window, then control the switching element to connect the first and second PV array groups in the series arrangement;
otherwise, control the switching element to connect the first and second PV array groups in the parallel arrangement.

4. The PV inverter system of claim 1 wherein the controller is configured to:
determine if the measured DC voltage output from the first and second PV array groups is less than the minimum voltage value of the voltage operating window; and
if the measured DC voltage output from the first and second PV array groups is less than the minimum voltage value of the voltage operating window, then control the switching element to connect the first and second PV array groups in the series arrangement.

5. The PV inverter system of claim 1 wherein the selective connection of the pair of PV array groups to the DC-to-AC power inverter in one of the series arrangement and the parallel arrangement expands the DC voltage window of the DC-to-AC power inverter.

6. The PV inverter system of claim 1 wherein each of the first and second PV array groups comprises at least one PV array, and wherein the first PV array group and the second PV array group each include an equal number of PV arrays such that the total number of PV arrays in the first and second PV array groups comprises an even number of PV arrays.

7. The PV inverter system of claim 1 wherein the switching element comprises one of a relay, an IGBT, an SCR, contactors, a circuit breaker, or an array of tie contactors.

8. A method for controlling the DC voltage provided to a photovoltaic (PV) inverter from a plurality of PV arrays, the method comprising:
measuring a DC voltage output from a pair of PV array groups, the pair of PV array groups including a first PV array group and a second PV array group;
comparing the DC voltage output from the first and second PV array groups to a pre-determined voltage operating window of the PV inverter, the pre-determined voltage operating window having lower and upper voltage limits associated therewith; and
controlling switching of a switching device connected between the PV inverter and the pair of PV array groups based on the comparison of the DC voltage output from the first and second PV array groups to the pre-determined voltage operating window of the PV inverter, such that the pair of PV array groups is selectively connected to the PV inverter in one of a series arrangement and a parallel arrangement by way of the switching device.

9. The method of claim 8 wherein comparing the DC voltage output comprises:
determining if the measured DC voltage output from the first and second PV array groups is equal to or less than half the value of the upper voltage limit of the voltage operating window;
if the measured DC voltage output from the first and second PV array groups is equal to or less than half the value of the upper voltage limit of the voltage operating window, then controlling the switching device to connect the first and second PV array groups in the series arrangement;
if the measured DC voltage output from the first and second PV array groups is greater than half the value of the upper voltage limit of the voltage operating window, then controlling the switching device to connect the first and second PV array groups in the parallel arrangement; and
turning on the PV inverter if the DC voltage output from the first and second PV array groups in the series connection is less than the upper voltage limit of the voltage operating window and greater than the lower voltage limit of the voltage operating window.

10. The method of claim 9 wherein connecting the first and second PV array groups in the series arrangement doubles the level of DC voltage received by the PV inverter as compared to the level of DC voltage received by the PV inverter when the first and second PV array groups are connected in the parallel arrangement.

11. The method of claim 8 wherein the DC voltage output from the pair of PV array groups is measured on a continuous basis or on a periodic basis at certain pre-determined intervals, such that the switching device is dynamically controlled during operation of the plurality of PV arrays and the PV inverter.

12. The method of claim 8 wherein controlling switching of the switching device comprises selectively switching one of a relay, an IGBT, an SCR, and an array of tie contactors.

13. A photovoltaic (PV) system comprising:
a PV inverter configured to invert a DC power to an AC power, the PV inverter comprising:
an input electrically coupled to a pair of PV array groups, the input configured to receive DC power generated by the pair of PV array groups in response to received solar irradiation;
a plurality of switches configured to transform the DC power into an AC power; and
an output configured to transfer the AC power to a load;

a switching element positioned between the pair of PV array groups and the PV inverter, the switching element being configured to selectively connect the pair of PV array groups to the PV inverter in one of a series arrangement and a parallel arrangement, so as to control a level of DC voltage received by the PV inverter from the pair of PV array groups; and a controller configured to control switching of the switching element for connecting the pair of PV array groups to the PV inverter in one of the series arrangement and the parallel arrangement;

wherein the controller is configured to:
measure the DC voltage output from the first and second PV array groups;
compare the DC voltage output from the first and second PV array groups to a voltage operating window of the PV inverter; and
control the switching element to connect the first and second PV array groups in one of the series arrangement and the parallel arrangement based on the comparison of the measured DC voltage output of the first and second PV array groups to the voltage operating window.

14. The PV system of claim 13 wherein connecting the first and second PV array groups in the series arrangement doubles the level of DC voltage received by the PV inverter as compared to the level of DC voltage received by the PV inverter when the first and second PV array groups are connected in the parallel arrangement.

15. The PV system of claim 13 wherein the controller is configured to:
based on the measured DC voltage output, determine if the level of DC voltage to be received by the PV inverter from the pair of PV array groups if the switching element is switched to connect the pair of PV array groups to the PV inverter in the series arrangement falls within the voltage operating window; and
control the switching element to connect the first and second PV array groups in the series arrangement if the level of DC voltage to be received by the PV inverter from the pair of PV array groups in the series arrangement falls within the voltage operating window;
otherwise, control the switching element to connect the first and second PV array groups in the parallel arrangement.

\* \* \* \* \*